(12) United States Patent
Brewer (10) Patent No.: US 6,819,168 B1
(45) Date of Patent: Nov. 16, 2004

(54) INTEGRATOR WITH HIGH GAIN AND FAST TRANSIENT RESPONSE

(75) Inventor: Robert John Brewer, Lambourn (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/294,853

(22) Filed: Nov. 14, 2002

Related U.S. Application Data (63) Continuation-in-part of application No. 09/925,074, filed on Aug. 8, 2001, now Pat. No. 6,677,799.

(51) Int. Cl.$^7$ ................................................ G06G 7/26
(52) U.S. Cl. ...................................... 327/560; 330/302
(58) Field of Search ................................ 327/344, 436, 327/560; 330/302, 305, 306, 310, 9, 109, 98

(56) References Cited

U.S. PATENT DOCUMENTS

| | | | |
|---|---|---|---|
| 4,205,276 A | 5/1980 | Wright et al. ................ 330/294 |
| 4,667,164 A | 5/1987 | Doluca ........................ 330/253 |
| 4,731,553 A | 3/1988 | Van Lehn et al. ............. 326/27 |
| 5,124,663 A | 6/1992 | McEntarfer et al. ........... 330/9 |
| 5,252,868 A | 10/1993 | Miida et al. ................. 327/277 |
| 5,365,126 A | 11/1994 | Krenik et al. ................. 326/27 |
| 5,825,250 A | 10/1998 | Tomasini et al. ........... 330/292 |
| 5,963,047 A | 10/1999 | Kwong et al. ................ 326/27 |
| 6,087,853 A | 7/2000 | Huber et al. .................. 326/83 |
| 6,600,352 B2 * | 7/2003 | Miyamoto ................... 327/161 |

OTHER PUBLICATIONS

Copy of application 09/925,074.

* cited by examiner

Primary Examiner—Linh M. Nguyen
(74) Attorney, Agent, or Firm—Wolf, Greenfield & Sacks, P.C.

(57) ABSTRACT

A multi-stage integrator achieves a relatively high small-signal gain, broad bandwidth, and very clean transient pulse response. Only simple amplifying stages (typically including an inverting amplifier(s)) are used. A high gain amplifier is coupled between an integrator input node and amplifier output node. A broadband single stage amplifier (which may comprise or act as a transconductor), may act as a current source for the output transistor and load, coupled between the integrator input node and output node. Preferably, a capacitance is coupled from the integrator input to the amplifier output. A frequency-selective element or network steers signal components to the single stage amplifier or the integrator appropriately to produce a combined output that has the desired characteristics.

14 Claims, 7 Drawing Sheets

INTEGRATOR WITH HIGH GAIN AND FAST TRANSIENT RESPONSE

This application is a continuation-in-part of Ser. No. 09/925,074 filed Aug. 8, 2001, now U.S. Pat. No. 6,677,799, which is hereby incorporated.

FIELD OF THE INVENTION

This invention relates generally to circuits such as operational amplifiers ("op amps" or "op-amps") for amplifying analog signals and in particular to CMOS operational amplifiers, and is more particularly directed toward a multi-stage integrator having high gain and fast transient response, for use in, e.g., op-amps.

BACKGROUND OF THE INVENTION

Figure 1:
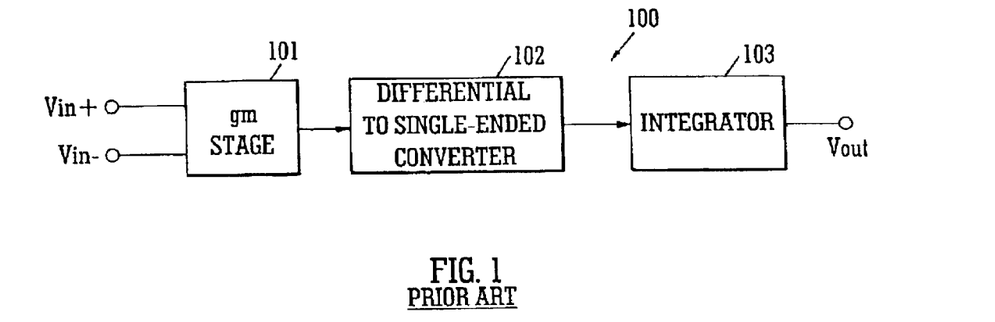
FIG. 1 depicts a conventional operational amplifier of the prior art in block diagram form.
Figure 2A:
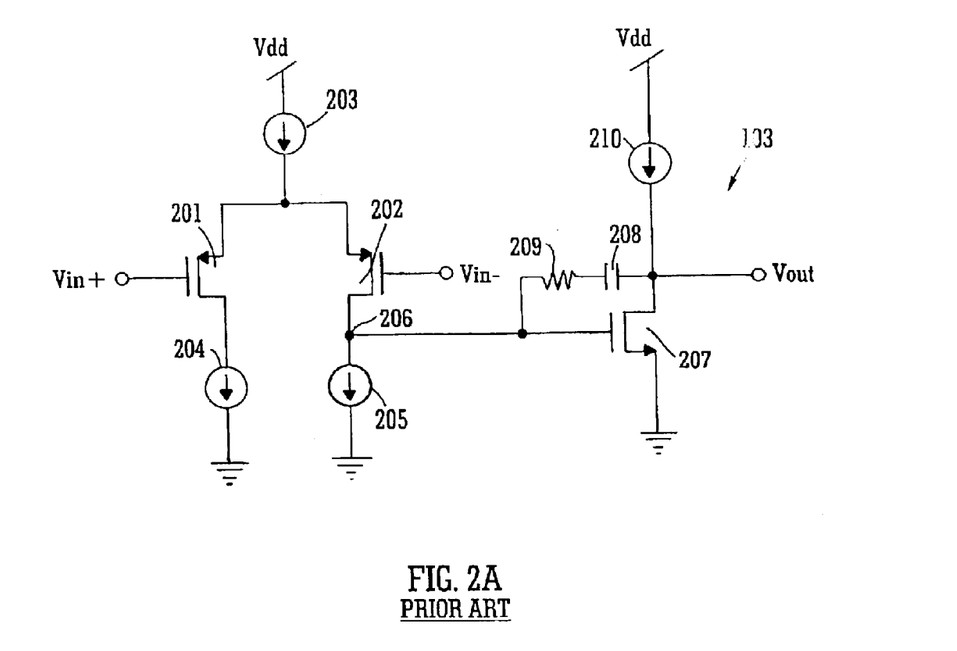
FIG. 2A is a more detailed schematic representation of the op amp of FIG. 1.

The conventional op amp, illustrated in FIG. 1 in block diagram form, and generally depicted by the numeral 100, comprises two analog, so-called linear amplification gain stages. The first functions as a differential transconductance ($g_m$) stage 101 and the second as an integrator 103, coupled by a differential to single-ended converter 102 (which may be incorporated into or merged with the transconductance stage. The conventional op amp 100 is illustrated in more detail in FIG. 2.

As shown in FIG. 2A, the $g_m$ stage 101 comprises a differential pair 201, 202 with a single current source "tail" 203 (both typically, and as an example, p-type insulated-gate field effect transistors—IGFETs), and two current source loads 204, 205 (typically, and as an example, provided by n-type transistors). By selecting an output 206 from only one of the differential input stages, differential to single-ended conversion is accomplished; or, conventionally, current sources 204 and 205 are implemented as a mirror with single-ended output 206 derived from the high impedance side of the mirror.

This single-ended output 206 is then applied to the integrator stage 103. In the implementation shown, the integrator 103 includes a n-type output transistor 207 with a current source tail 210, and Miller capacitor 208. A nulling resistor 209 has been added for the sake of stability.

In sub-micron CMOS technology, it is difficult to achieve an integrator with a combination of high gain and wide bandwidth with a high slew rate and a good transient response to high frequency events. The active devices are fast, but a single gain stage has very low DC gain. A multi-stage integrator (typically three inverting gains) gives high gain with simple (linear) inverting amplifiers, but must be stabilized with an internal nested pole; that sharply degrades the bandwidth, however, and thus results in a poor slew rate and poor transient response.

Figure 2B:
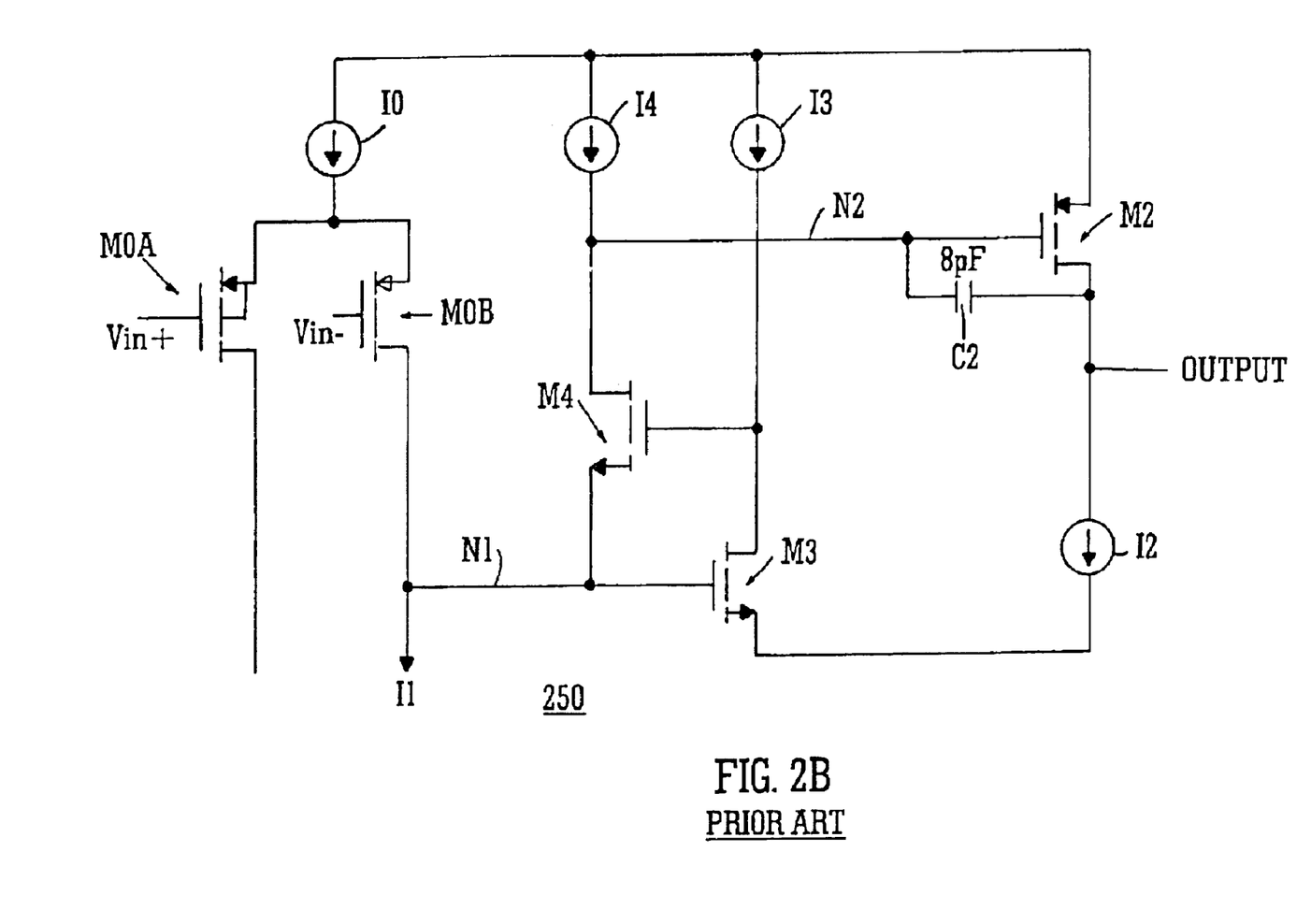
FIG. 2B is a schematic circuit diagram of another prior art op amp (integrator) architecture.

Another conventional rendering of the prior art operational amplifier of FIG. 1 is shown at 250 in FIG. 2B. In this type of circuit, all frequencies of an input signal $V_{in}$ applied differentially to the gates of transistors M0A and M0B pass through a conventional signal path comprising a first gain stage (the differential pair of transistors M0A and M0B) (which also yields differential-to-single-ended conversion) and a folded active cascode architecture integrator formed by transistors M2, M3 and M4 along with capacitor C2. The overall gain may be calculated to be, to a first approximation, $(g_m0*g_m4*g_m3*g_m2)/(g_d0*g_d4*g_d3*g_d2)$, where $g_mx$ is the transconductance of transistor "Mx"; that is, the variation in their drain currents with respect to gate voltage; and $g_dy$ is the output conductance of transistor "My" or, in other words, the ratio of drain current change with respect to drain voltage.

Current sources I0–I4 may be implemented in any preferred way. Since the output conductance of current source 14 is critical and must be very low, of course, it will conventionally be implemented as an actively cascoded PMOS current source. The overall gain, noted above, is the same as would result from a single differential transconductance stage followed by a three transistor gain in the integrator. This circuit has very high low frequency gain (i.e., an average gain of greater than 30 dB per stage is reasonable in small geometry CMOS, to give an overall gain of greater than 120 dB). However, it suffers from poor transient response due to the number of nodes in the signal path, each of which will have parasitic capacitance, causing a ringing transient response.

Consequently, a need arises for an integrator implementation that provides high gain and good transient response and is suitable for sub-micron CMOS manufacture, while offering simplicity of design and economy in overall circuit area.

SUMMARY OF THE INVENTION

These needs and others are addressed by the present invention, in which an integrator for an op-amp provides an amplifier which achieves a high small-signal gain on the order of 80 dB, wide (i.e., 200 MHz typical) bandwidth, and very clean transient pulse response. The integrator may be implemented in as few as three stages.

In accordance with one aspect of the invention, a high-gain, fast response amplifier comprises a first (high gain, analog) amplifier path including a plurality of amplifying stages and a first amplifier path output, and providing a relatively high gain to signals bellow a selected frequency; a second, wide-bandwidth, analog amplifier path having a common input with the first amplifier path, and including an amplifying stage and a second amplifier path output; and means (e.g., a resistor or a direct connection) interconnecting the first and second amplifier paths to form a composite amplifier having the common input as the input thereto and the output of the second amplifier path as the output thereof.

The first amplifier path may include first and second cascaded amplifying stages, while the amplifying stage in the second path may include a compensation network connected in feedback to improve stability. In a preferred form of the invention, the compensation network includes a capacitance connected in feedback around the first amplifier path.

A still further aspect is a high-gain, fast response amplifier comprising a first amplifier path including a plurality of amplifying stages between an input and a first amplifier path output, and providing a relatively high gain to signals below a selected frequency presented to said input; a second, analog amplifier path receiving-signals corresponding to those supplied to said input and including an amplifying stage (e.g., a single-stage amplifier) operatively connected between said input and a second analog amplifier path output; and means interconnecting the first and second amplifier paths to form a composite amplifier having said input as the input thereto and the output of the second, analog amplifier path as the output thereof. The amplifying stage in the second path may comprise a transconductor.

An additional feature is an integrator providing first and second signal paths between an integrator input and output. Such an integrator comprises the first signal path including multiple cascaded amplifying stages coupled between the integrator input and an amplifier output; the second signal path limited to a single transconductor stage coupled between integrator input and output; a capacitance coupled between the amplifier output and the integrator input; and the amplifier output and the integrator output being coupled such that the first signal path provides a relatively high-gain, narrow band amplifier, and a second signal path provides a relatively low-gain, broadband amplifier, and the first and second signal paths combine to form a single amplifying structure with relatively high low-frequency gain, and relatively fast high-frequency transient response.

Yet another aspect or feature is an improvement in an amplifier for use in driving capacitive load connected to the amplifier output node, such amplifier being of the type having an input transconductor stage followed by an actively cascoded integrator stage which has a cascode circuit receiving an output of said input stage and an output transistor driven by an output of the cascode circuit, the output transistor also being connected to a current source load at said output node. The improvement comprises the current source being a transistor having a control electrode connected to an input node of the cascode circuit; and a capacitance connected to restrict the bandwidth of the cascode circuit relative to the bandwidth of the amplifier, such that within a portion of the bandwidth of the amplifier, a contribution of the cascode circuit to the amplifier output is reduced.

A still further aspect of the invention is an amplifier circuit comprising a first node and a second node, the first node being an input node and the second node being the amplifier output node; an active cascode circuit having an input connected to the first node and a control node connected to a frequency-selective control means which controls the frequency response of the cascode circuit; an output transistor having a first electrode connected to the second node, a second electrode operatively connected to a supply voltage and a control electrode connected to an output node of the cascode circuit; a current source connected to the output node, the current source having a control element connected to the first node; and at least one capacitance connected to the output node to stabilize the output transistor. The capacitance may have another side (e.g.. electrode) connected to a control element of the output transistor. Or such a capacitance may have another side connected to the first node. Or both arrangements of capacitances may be used. Further, the frequency-selective control means may be a capacitance connected between the control element of the cascode amplifier and ground, or a more complex network. A transconductance gain stage may be included, having an input receiving at an amplifier input node a signal to be amplified and an output connected to said first node.

Further objects, features, and advantages of the present invention will become apparent from the following description and appended drawings.

BRIEF DESCRIPTION OF THE DRAWINGS

In the drawing, like reference indicators denote like elements and.

DETAILED DESCRIPTION OF THE INVENTION

Figure 3:
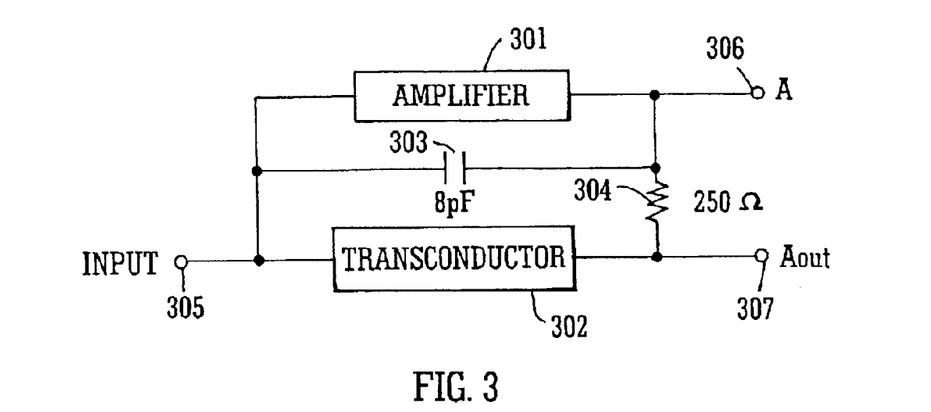
FIG. 3 depicts an example of an integrator in accordance with the present invention.

In accordance with the present invention, a high-gain, fast response integrator is described that offers distinct advantages when compared with the prior art. FIG. 3 depicts a first embodiment of an integrator in accordance with the present invention. A high gain amplifier 301 is coupled between an integrator input node 305 and amplifier output node A 306. A broadband transconductor is coupled between the integrator input node 305 and integrator output node 307. A resistor 304 connects the amplifier output node A 306 and the integrator output 307, while a capacitor 303 is coupled from the integrator input 305 to amplifier output 306. The conductance of the resistor 304 (the reciprocal of the resistance, or 1/R) is selected to be substantially equal to the transconductance $g_m$ of the transconductor 302.

Figure 4:
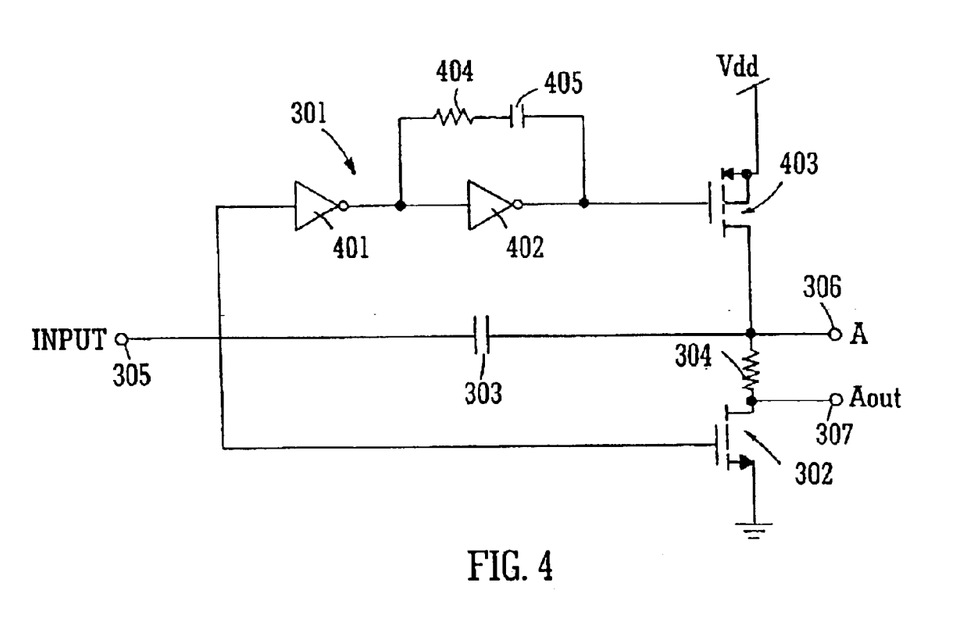
FIG. 4 illustrates the integrator of FIG. 3 in greater detail.

The diagram of FIG. 4 depicts the integrator of FIG. 3 in more detail. As can be appreciated from an examination of FIG. 4, the high gain amplifier 301 comprises simple inverting amplifier stages 401 and 402, with a compensation network connected in feedback around inverting amplifier 402 to enhance stability. It will be apparent that amplifier 301, with 3 gain stages in a closed loop formed by capacitor 303, is inherently unstable. The nested compensation components 404 and 405 make this loop stable according to well-known principles. In the circuit of FIG. 4, the compensation components 404,405 form a series-connected RC (resistor-capacitor) network.

The output of inverting amplifier 402 drives amplifier output stage 403, a p-channel enhancement mode MOSFET. The transconductor 302 is an NMOS transistor coupled between the inverting amplifier input 305 and the inverting amplifier output 307. As discussed above, resistor 304 is coupled between the high gain amplifier output 306 and the integrator output 307, with the capacitor 303 coupled between the amplifier output 306 and the integrator input 305 (the capacitor is connected as a feedback element from the amplifier output 306 to the amplifier input 305). The value of the resistor 304 is substantially equal to the reciprocal of the transconductance of the transconductor 302, or $1/g_m$.

Operation of the integrator of FIG. 4 may be understood in one of two ways. First of all, due to the propagation delay through inverting amplifier 402, there will be severe transient ringing at the amplifier output node A 306. That high frequency voltage will be fed back by capacitor 303 to the input 305. The input 305 is assumed to be high impedance because, in application, the prior stage is typically a current source output. The voltage at the amplifier output node A 306 will induce a current in resistor 304 given by its conductance g (1/R). The same voltage at the input 305 will induce a current in the transconductor 302 given by its transconductance $g_m$. If g (1/R)=$g_m$, then the integrator output 307 remains unaffected (independent of load capacitance).

In the alternative, the circuit may be regarded as two amplifying paths in parallel with common input 305 and output 307. Amplifier 301, comprising simple inverting amplifiers 401 and 402 and output transistor 403, is a high-gain amplifier with low bandwidth and poor transient response. The transconductor 302 is a low-gain, high bandwidth amplifier with good transient response. The two signal paths, one through the amplifier 301 and the other through the transconductor 302, sum benignly via resistor 304 to form a single amplifying structure, or composite amplifier, with high low frequency gain and good high frequency transient response. It is noteworthy that the integrator output 307 has a low dynamic output impedance related to the transconductance of transconductor 302 ($1/g_m$) so the integrator output 307 is relatively tolerant of load capacitance.

Figure 5:
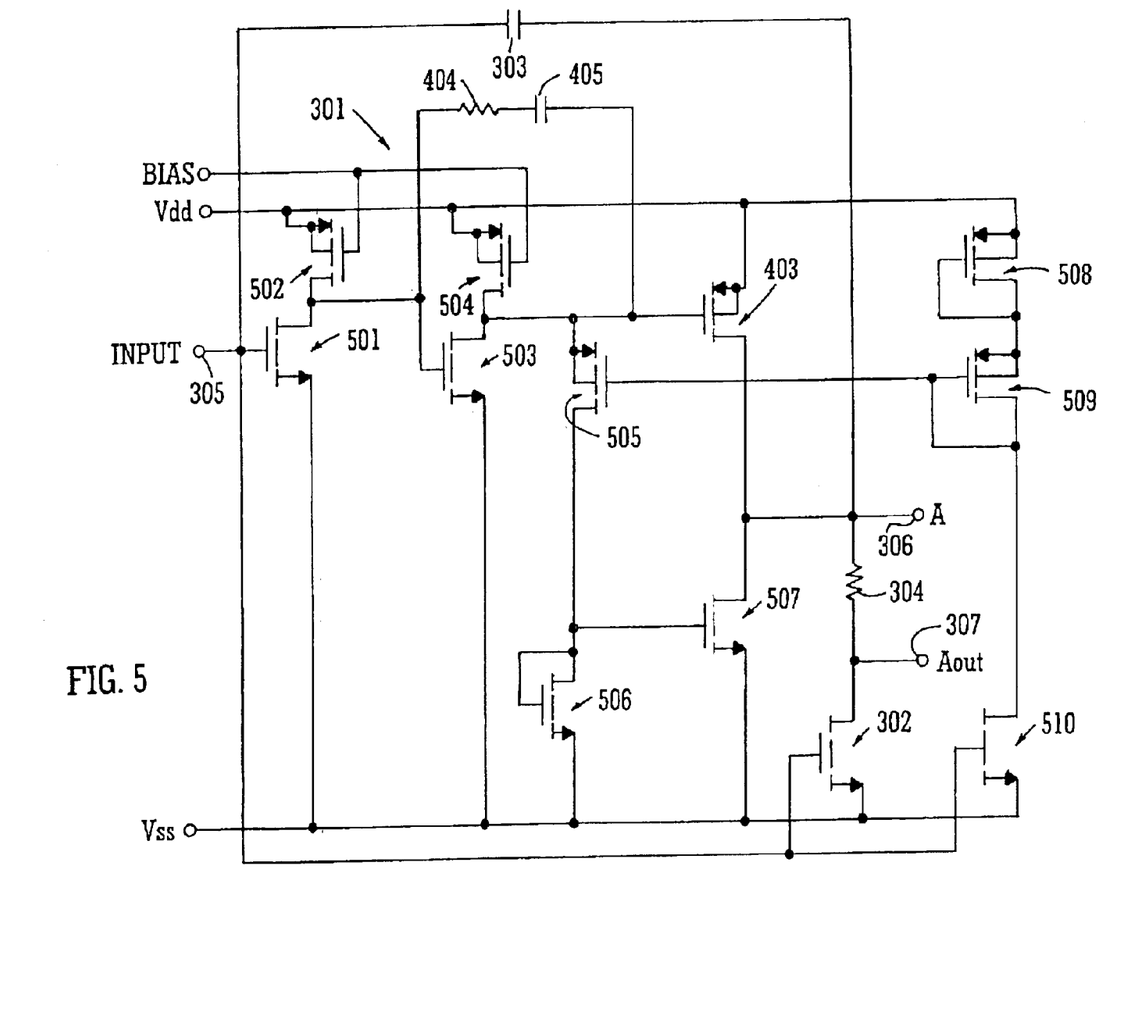
FIG. 5 is a device-level schematic diagram of the integrator of FIG. 3.
Figure 6:
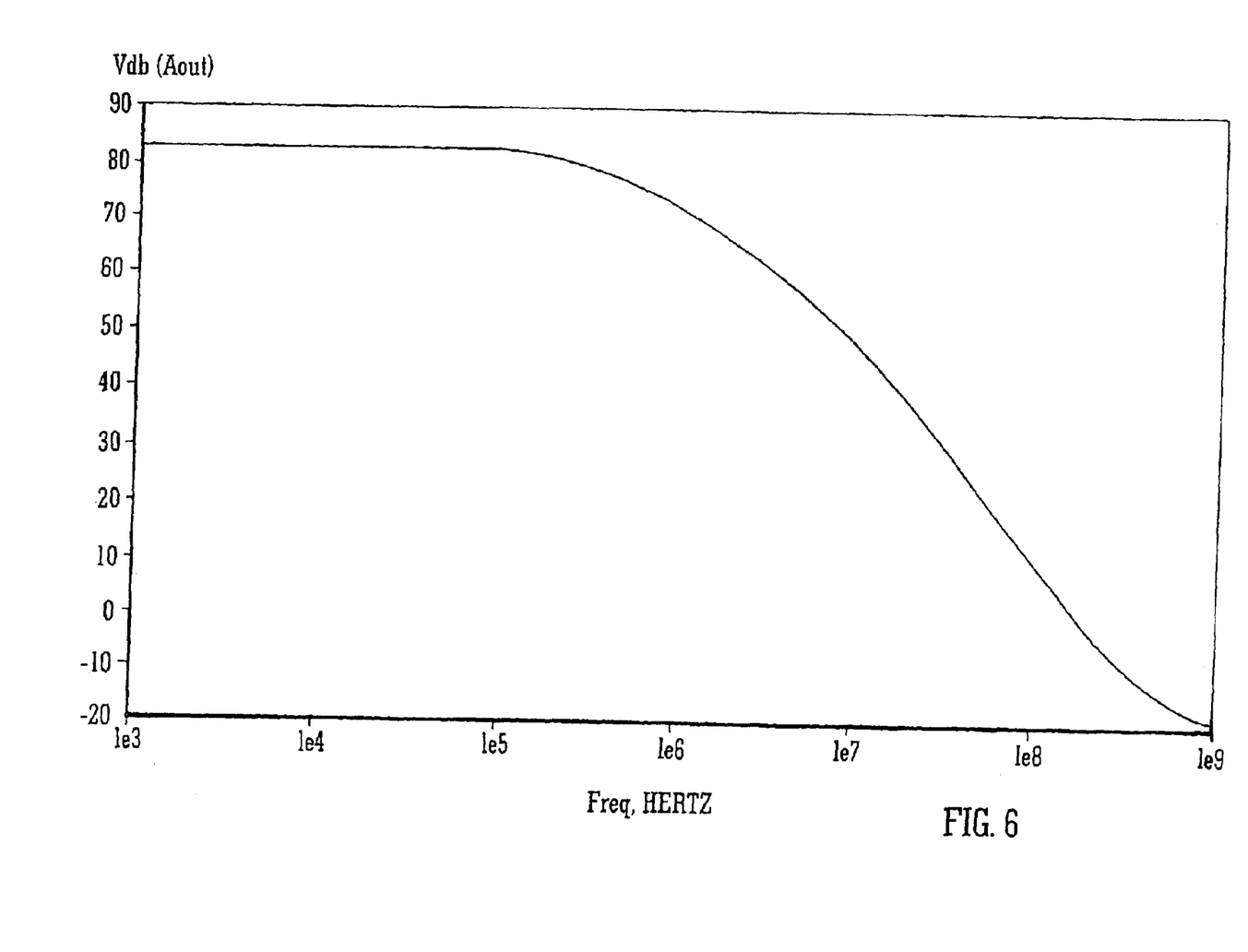
FIG. 6 shows gain versus frequency performance of an amplifier suitable for use in an integrator in accordance with the present invention.

A device level schematic for implementation of such an illustrative integrator is shown in FIG. 5. As noted above, the amplifier 301 comprises three sequential inverting amplifiers 501, 503, 403, made stable by an internal nested compensation resistor 404 and capacitor 405. The third inverting amplifier 403 has (optionally) a class A/B construction to boost the output drive capability. This amplifier has a high gain, greater than 80 dB, typically (small signal), as illustrated by the gain versus frequency performance plot of FIG. 6. However, due to its nested pole, it has low bandwidth and poor transient response when the loop is closed. The transconductor 302 is a simple NMOS inverting device that has a low voltage gain but very wide bandwidth.

The bias voltage applied to transistors 502 and 504 configures them to act as constant current loads to gain devices 501 and 503. Transconductors 508, 509 and 510 are interconnected to form a constant voltage on the gate of device 505, which biases device 505 such that a proportion of the AC current flowing to the gate of device 403 is diverted to modulate the gate of device 507, thus establishing a bi-directional push-pull amplifying action.

The amplifier 301 (devices 501, 503, and 403) has a poor transient response, so that the ultimate effect at node A 306 of an applied input pulse is severe ringing. This ringing voltage causes a current to flow in the resistor 304 (to the integrator output A out 307) proportional to the conductance of the resistor 304. The conductance of the resistor 304 is the reciprocal of its resistance, or $1/R$.

This voltage will also be fed back via capacitor 303 to the integrator input 305, which conventionally will be driven from a high impedance current source, as mentioned previously. The ringing voltage thus appears on the input of the transconductor 302, and causes a current to flow from the output A out 307 equal to the transconductance of the transconductor 302. If $g_r = g_m$ the currents cancel and the voltage on A out 307 is substantially undisturbed by the ringing of the main amplifier.

Figure 7:
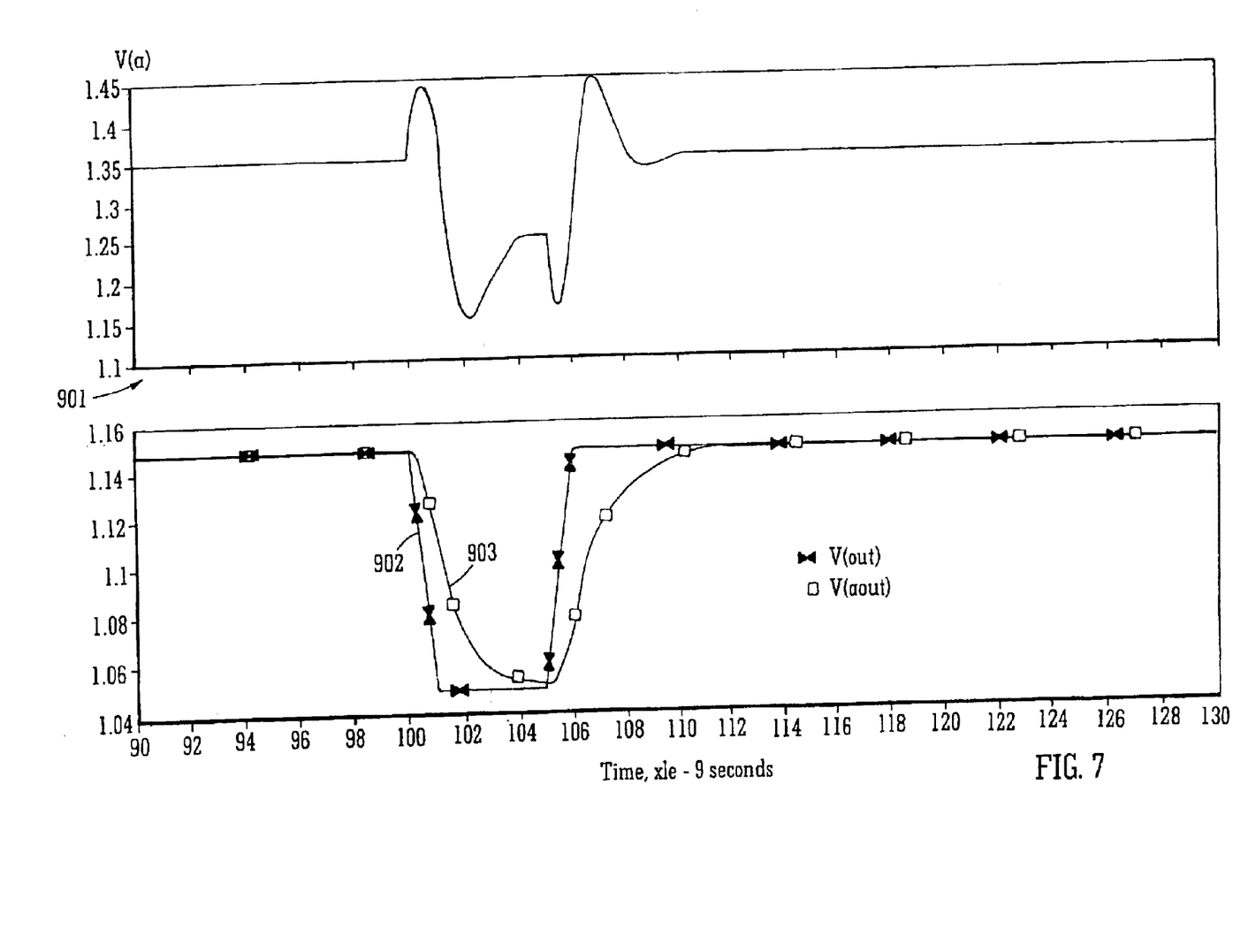
FIG. 7 illustrates pulse response timing diagrams for the integrator of FIG. 5.

This is illustrated by the pulse response timing diagrams of FIG. 7, that illustrate output waveforms in response to a 5 ns (nanosecond) input pulse. Ringing at the amplifier output is depicted in waveform 901. The transconductor 302 exhibits a fast transient response, however, so its normal pulse response is as shown in waveform 902. With feedback as described above, the pronounced ringing response of the main amplifier is effectively cancelled, and the integrator output pulse appears as shown in waveform 903.

Above, there is discussed a method of achieving an improved op-amp for charging sampling capacitive loads, avoiding a variety of prior art limitations, by passing the higher frequencies in the input signal through a short path comprising a single wide bandwidth gain stage in parallel with the three gain stages in the integrator, which processed the lower frequency content, and then combining the results from those two paths. Further improvement is possible with another design which implements the same methodology. This design is shown as the circuit 1000 in FIG. 8.

Figure 8:
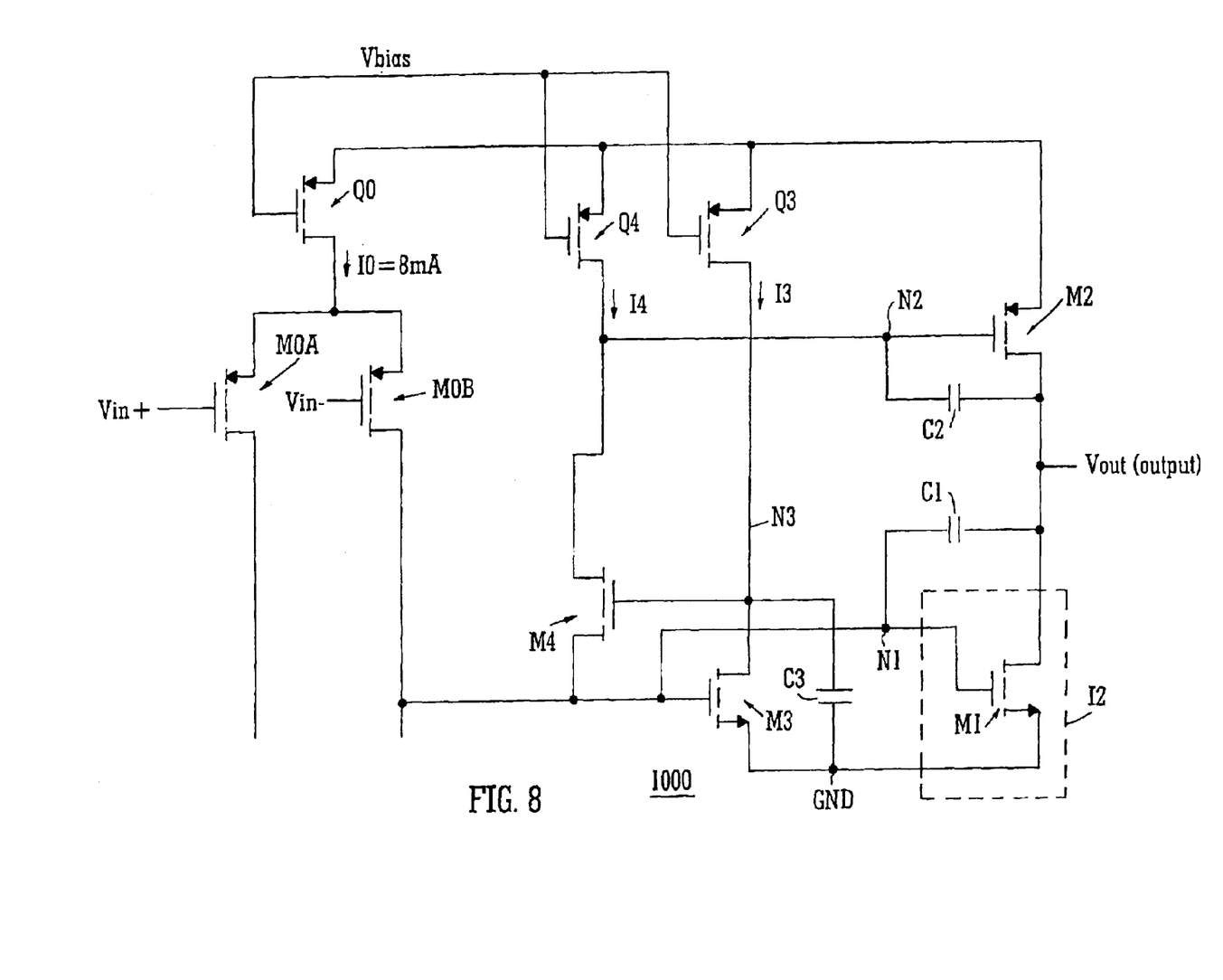
FIG. 8 is a schematic circuit diagram depicting a second circuit diagram of an integrator in accordance with the invention.

Using like reference designations, a current source 12 is implemented as an NMOS transistor M1 whose gate is connected to node N1 for bias. At lower frequencies, approximating to DC, capacitors C1–C3 may be considered ineffective (i.e., open circuits). Node N1 exhibits a low dynamic impedance and approximates a static voltage source. That source presents a voltage to the gates of transistors M1 and M3 such that the currents through them are in the ratio of their transconductances. As current 13 essentially equals the current through transistor M3, the current in transistor M1 is given by the product of current 13 and the ratio $g_m1/g_m3$. A low frequency input differential voltage produces, by a transistor M0B in the transconductance stage, a low frequency AC current into node N1. Looking into the gate of transistor M1, the conductance is low (capacitive). However, looking into the source of transistor M4, the conductance is higher and is easily shown to be the transconductance of transistor M4 multiplied by the voltage gain of transistor M3 and its current source load 13. Thus, the signal current flows selectively to node 2 and drives the output via transistor M2. Little signal current flows into transistor M1 and that device acts as a constant current source whose current magnitude is simply and reliably determined by the value of the constant current load 13 multiplied by the width ratio of transistors M1, M3. The voltage gain from input to output is the product of the voltage gains of transistors M0, M3, M4 and M2; this product of four gain stages can easily be designed to exceed one million.

Now, consider higher signal frequencies. The effect of capacitance C3 (which may be an explicit capacitance or could just be the naturally occurring implicit parasitic capacitance of node N3) is to form a low impedance path (i.e., an AC short circuit) between node N3 and ground node GND, killing the gain of transistor M3. As node N3 is pulled to AC ground potential, so is the gate of cascode transistor M4. As a result, the cascode transistor M4 ceases to be active and relaxes back to a passive cascode condition, and the dynamic impedance of node N1 will rise. Transistor M1 then becomes actively driven by the signal, which has been applied via the output of transistor M0B to node N1, and the signal path changes so that it passes through M1. That is, the signal path now passes through one wideband gain stage.

More completely, the signal current in node N1 thus "sees" a conductance of the transconductance of transistor M4 when looking up toward node N2. At the same time, the effect of capacitor C1 in feedback around transistor M1 is to make the conductance looking into the gate of transistor M1 approach a value of the transconductance of transistor M1. Since transistor M1 will normally have a higher transconductance than transistor M4, the signal current flows selectively into transistor M1 and the output is driven by that transistor. The signal path now comprises two simple inversions through transistors M0A, M0B and M1, with one Miller compensation capacitor. This is a minimally low delay path.

Current source 14 should ideally have a very high dynamic impedance. In practice, this typically will need to be an active cascode. The headroom required is that of a threshold plus a saturation voltage. The other current sources can be simple.

For high accuracy applications, the amplifier should normally be made differential. Thus, it will be apparent that there will be another symmetrical integrator section and the circuit will require some form of common mode feedback, conventionally by adjusting the current source (I0) in the first transconductor stage.

Note that the transconductor stage is conventional and that even though the input is conventionally applied to the gates of transistors M0A, M0B, node N1 may be considered an input node, also (although it would receive a current input rather than a voltage input). To distinguish the two input possibilities, node N1 is referred to as an input node to the cascode circuit and the gates of transconductor transistors M0A, M0B are referred to as the amplifier input node.

Accordingly, there is shown in FIG. 8 an actively cascoded integrator where the current source 12 for the output PMOS device M2 is an NMOS transistor M1 whose gate connection is to the source to the active cascode transistor M4 and the active cascode has a bandwidth less than that of the desired amplifier. That reduced bandwidth is a result of the capacitance between the gate of the active cascode and ground, such that within the desired bandwidth of the amplifier the signal path partially or wholly diverts from a path through the active cascode at lower frequencies to a path through transistor M1 at higher frequencies. The outputs from the two paths are combined to produce the integrator/amplifier output.

The integrator may be configured conventionally as a Miller integrator with a capacitor C2 in feedback (from output node OUT to node N2 at the gate of transistor M2) to stabilize the overall amplifier. This can be achieved with one or two capacitors from the output node N2 back to either node N1 or node N2, or both. In the exemplary schematic, both of such capacitors C2 and C4, respectively, are shown. It is further advantageous to have both capacitors in cases where the output is driving a switched capacitive load. It will be seen that node N2 has a high bi-directional dynamic impedance. Node N1 has a high unidirectional dynamic impedance to large voltage excursions in a positive direction. This may be exploited. If the output is pulled low by being connected to an under-charged capacitor, then capacitor C2 will pull node N2 in a negative direction, causing a large increase in the current in transistor M2, which will then serve to recharge the load capacitor. If, by contrast, the output is pulled high by being connected to an over-charged capacitor, then capacitor C1 will pull node N1 in a positive direction, which it is relatively free to do. This causes a large increase in the current in transistor M1, a portion of which is drawn from, and discharges, the load capacitor.

With the component values shown in the table below, circuit 1000 has been found to be capable of driving a capacitive load of 50 pF with recovery from 0.5 volt differential capacitor recharge/discharge to a few parts per million (ppm) in about 25 nanoseconds. Of course, that assumes certain process parameters and device geometries; accordingly, results will vary according to the specific device geometries and manufacturing processes, as well as supply voltage. Additional devices which are not shown may be required, as is conventionally known. Thus, there is shown an op-amp design which can charge a capacitive load to a high accuracy in a short period of time. This is important for driving analog-to-digital converters which sample the signal voltage on a load capacitor. At high accuracy levels, the effect of thermal noise on the capacitor requires that the load capacitor be relatively large. For example, to make a sigma-delta converter with signal-to-noise ratio much greater than 100 dB and total harmonic distortion much less than −100 dB over a signal bandwidth of 1 MHz, a reasonable requirement is to charge a capacitor of 50 pF to an accuracy of 4 ppm in 25 ns.

To reiterate, an approach was sought which would provide an op-amp with high gain at low frequencies and a low propagation delay at high frequencies. This combination permits settling to a high accuracy in a short time (i.e., good transient response) when charging a capacitive load. To achieve very high DC (i.e., low frequency) gain in a small geometry CMOS process, it is necessary to have multiple gain stages. For example, there may be one gain element in the front-end transconductor stage and three gain elements in the integrator stage. However, to achieve low propagation delay, there should preferably be no more than two simple inverting amplifiers with one Miller capacitor in the signal path. The exemplary designs shown herein achieve both aims by having two signal paths through the integrator section, one with three gain elements and the other with a single gain element, and a means for routing or splitting the signal through the appropriate path as a function of signal frequency. Fundamentally, an amplifier driving a sampling capacitive load functions differently from an amplifier driving a continuous load, whether that load be resistive or reactive. If the signal is band-limited by a suitable anti-aliasing filter, the signal seen in the conventional forward signal path does not contain strong components above some selected frequency such as, for example, 1 MHz. However, the trouble is caused by high-frequency (e.g., GHz-range) "signal" components which originate in the switching load and propagate both backwards up the amplifier and loop around the feedback into the input. The design of an amplifier to handle these "signals" is fundamentally different from that of an amplifier driving a continuous load.

To work with deep sub-micron CMOS processes and be usable with reasonable low supply voltages, the amplifier is designed to work with a supply voltage not much greater than the output signal plus two saturation voltages, and also not much greater than about two threshold voltage two saturation voltages, total.

A low impedance output stage is used, which can symmetrically source and sink transient currents much greater than the quiescent current, to facilitate switching a capacitive load.

Having thus described an exemplary embodiment, it will be apparent that various modifications thereof and improvements thereto will readily occur to those skilled in the art. Such additional embodiments are intended to be within the spirit and scope of the invention which is only to be as required by the accompanying claims and equivalents thereto.

What is claimed is:

1. A high-gain, fast response amplifier comprising:
a first amplifier path including a plurality of cascaded amplifying stages between an input and a first amplifier path output, and providing a relatively high gain to signals below a selected frequency presented to said input and including a compensation network connected in feedback to improve stability;
a second, analog amplifier path receiving signals corresponding to those supplied to said input and including an amplifying stage operatively connected between said input and a second analog amplifier path output; and
means interconnecting the first and second amplifier paths to form a composite amplifier having said input as the input thereto and the output of the second, analog amplifier path as the output thereof.

2. The amplifier of claim 1, wherein the amplifying stage in the second amplifier path comprises a single-stage amplifier.

3. The amplifier of claim 2, wherein the single-stage amplifier comprises a transconductor.

4. An integrator providing first and second signal paths between an integrator input and output, the integrator comprising:
- the first signal path including multiple cascaded amplifying stages coupled between the integrator input and an amplifier output;
- the second signal path limited to a single amplifying stage coupled between integrator input and output;
- a capacitance coupled between the amplifier output and the integrator input; and
- the amplifier output and the integrator output being coupled such that the first signal path provides a relatively high-gain, narrow band amplifier, and a second signal path provides a relatively low-gain, broad-band amplifier, and the first and second signal paths combine to form a single amplifying structure with relatively high low-frequency gain, and relatively fast high-frequency transient response.

5. In an amplifier for use in driving capacitive load connected to the amplifier output node, said amplifier being of the type having an input transconductor stage followed by an actively cascoded integrator stage which has a cascode circuit receiving an output of said input stage and an output transistor driven by an output of the cascode circuit, the output transistor also being connected to a current source load at said output node, the improvement comprising:
- the current source being a transistor having a control electrode connected to an input node of the cascode circuit; and
- a capacitance connected to restrict the bandwidth of the cascode circuit relative to the bandwidth of the amplifier, such that within a portion of the bandwidth of the amplifier, a contribution of the cascode circuit to the amplifier output is reduced.

6. An amplifier circuit comprising:
- a first node and a second node, the first node being an input node and the second node being the amplifier output node;
- an active cascode circuit having an input connected to the first node and a control node connected to a frequency-selective control means which controls the frequency response of the cascode circuit;
- an output transistor having a first electrode connected to the second node, a second electrode operatively connected to a supply voltage and a control electrode connected to an output node of the cascode circuit;
- a current source connected to the output node, the current source having a control element connected to the first node; and
- at least one capacitance having a first side connected to the output node to stabilize the output transistor.

7. The amplifier of claim 6 wherein the at least one capacitance also has another side connected to a control element of the output transistor.

8. The amplifier of claim 6 wherein the at least one capacitance also has another side connected to the first node.

9. The amplifier of claim 6 wherein the at least one capacitance comprises a first capacitance and a second capacitance, the first capacitance having another side connected to a control element of the output transistor and a second capacitance having another side connected to the first node.

10. The amplifier of any of claims 6–9 wherein the frequency-selective control means is a capacitance connected between the control element of the cascode amplifier and ground.

11. The amplifier of any of claims 6–9 further including a transconductance gain stage having an input receiving at an amplifier input node a signal to be amplified and an output connected to said first node.

12. The amplifier of any of claim 4–6 wherein any of said capacitances is a parasitic capacitance.

13. The amplifier of any of claims 4–6 wherein any of said capacitances is an explicit capacitor.

14. A high-gain and fast response analog amplifier comprising:
- a first analog amplifier path including a plurality of inverting amplifiers, each operating in a linear operating region, and a first amplifier path output;
- a second analog amplifier path having a common input with the first amplifier path, and a second analog amplifier path output and including a compensation network to improve stability; and
- a resistor interconnecting the first and second amplifier paths to form a composite amplifier having the common input as the input thereto and the output of the second, analog amplifier path as the output thereof.

* * * * *